(12) United States Patent
Kinzer et al.

(10) Patent No.: US 9,985,626 B2
(45) Date of Patent: May 29, 2018

(54) BIDIRECTIONAL GAN SWITCH WITH BUILT-IN BIAS SUPPLY AND INTEGRATED GATE DRIVERS

(71) Applicant: NAVITAS SEMICONDUCTOR, INC., El Segundo, CA (US)

(72) Inventors: Daniel M. Kinzer, El Segundo, CA (US); Ju Jason Zhang, Monterey Park, CA (US)

(73) Assignee: NAVITAS SEMICONDUCTOR, INC., El Segundo, CA (US)

( * ) Notice: Subject to any disclaimer, the term of this patent is extended or adjusted under 35 U.S.C. 154(b) by 173 days.

(21) Appl. No.: 15/011,301

(22) Filed: Jan. 29, 2016

(65) Prior Publication Data

US 2017/0222644 A1 Aug. 3, 2017

Related U.S. Application Data

(60) Provisional application No. 62/110,327, filed on Jan. 30, 2015.

(51) Int. Cl.
| | | |
|---|---|---|
| *H03K 17/687* | (2006.01) | |
| *H02M 7/5387* | (2007.01) | |
| *H01L 29/20* | (2006.01) | |
| *H01L 27/06* | (2006.01) | |

(52) U.S. Cl.
CPC ..... *H03K 17/6871* (2013.01); *H01L 27/0629* (2013.01); *H01L 29/2003* (2013.01); *H02M 7/5387* (2013.01)

(58) Field of Classification Search
CPC ............. H02M 7/5387; H03K 17/6871; H01L 27/0629; H01L 29/2003
See application file for complete search history.

(56) References Cited

U.S. PATENT DOCUMENTS

| | | | | |
|---|---|---|---|---|
| 5,815,384 A | * | 9/1998 | Hammond | H02M 5/225 363/127 |
| 8,878,495 B2 | * | 11/2014 | Perisic | H01M 10/44 320/137 |
| 2004/0208022 A1 | * | 10/2004 | Gibson | H02M 5/293 363/16 |

(Continued)

*Primary Examiner* — Jue Zhang
(74) *Attorney, Agent, or Firm* — Kilpatrick Townsend & Stockton

(57) ABSTRACT

A DC-AC converter is disclosed. The DC-AC converter generates an output AC signal, and has an input DC-AC converter which generates a first AC signal, a transformer device which receives the first AC signal and generates a second AC signal, and a first bidirectional switch which selectively connects a first transformer output terminal and a first output terminal. The DC-AC converter also has a first capacitor which powers the first bidirectional switch, a first charging circuit which charges the first capacitor, and a second bidirectional which selectively conduct connects a second transformer output terminal and a second output terminal. The DC-AC converter also has a second capacitor which powers the second bidirectional switch, and a second charging circuit which charges the second capacitor. Each of the bidirectional switches includes series connected transistors between first and second input/output terminals, and a transistor driver which drives the transistors.

7 Claims, 7 Drawing Sheets

(56) References Cited

U.S. PATENT DOCUMENTS

| | | | | |
|---|---|---|---|---|
| 2008/0055938 | A1* | 3/2008 | Kajouke | H02M 5/297 363/13 |
| 2011/0031930 | A1* | 2/2011 | Kajouke | H02M 3/33584 320/128 |
| 2012/0014140 | A1* | 1/2012 | Kajouke | B60L 11/1811 363/20 |
| 2012/0074949 | A1* | 3/2012 | Kepley | H02M 3/33584 324/426 |
| 2013/0170252 | A1* | 7/2013 | Nishino | H02M 1/08 363/21.02 |
| 2014/0027781 | A1* | 1/2014 | Ryu | H01L 29/7811 257/77 |
| 2014/0268959 | A1* | 9/2014 | Frohman | H02M 7/797 363/98 |
| 2014/0374766 | A1* | 12/2014 | Bahl | H01L 27/0629 257/76 |
| 2015/0131339 | A1* | 5/2015 | Furukawa | H02M 3/33584 363/21.04 |
| 2016/0268917 | A1* | 9/2016 | Ramsay | H02M 5/458 |

* cited by examiner

BIDIRECTIONAL GAN SWITCH WITH BUILT-IN BIAS SUPPLY AND INTEGRATED GATE DRIVERS

CROSS-REFERENCES TO RELATED APPLICATION

This application claims priority to U.S. Provisional Patent Application No. 62/110,327 filed Jan. 30, 2015, which is incorporated by reference herein in its entirety for all purposes.

FIELD OF THE INVENTION

The present disclosure relates generally to bidirectional switch circuits and more specifically to bidirectional switch circuits integrated with other circuits on a GaN or similar substrate.

BACKGROUND OF THE INVENTION

Electronic devices such as computers, servers and televisions, among others, employ one or more electrical power conversion circuits to convert one form of electrical energy to another. Some electrical power conversion circuits convert a DC voltage to an AC voltage using a circuit called an inverter. As many electronic devices are sensitive to the size and efficiency of the power conversion circuit, new inverter circuits and components may be required to meet the needs of new electronic devices.

SUMMARY OF THE INVENTION

One inventive aspect is a DC-AC converter configured to receive an input DC signal and to generate an output AC signal, and has an input port including first and second input terminals, an output port including first and second output terminals, and an input DC-AC converter configured to receive the input DC signal from the input port and to generate a first AC signal. The DC-AC converter also has a transformer device configured to receive the first AC signal and to generate a second AC signal across first and second transformer output terminals, and a first bidirectional switch connected between the first transformer output terminal and the first output terminal of the output port, where the first bidirectional switch is configured to selectively conduct current between the first transformer output terminal and the first output terminal of the output port according to at least one first control signal. The DC-AC converter also has a first capacitor connected across power terminals of the first bidirectional switch, where the first capacitor is configured to provide current to the first bidirectional switch to power the first bidirectional switch, a first charging circuit configured to charge the first capacitor based on current flowing between the first transformer output terminal and the first output terminal of the output port, and a second bidirectional switch connected between the second transformer output terminal and the second output terminal of the output port, where the second bidirectional switch is configured to selectively conduct current between the second transformer output terminal and the second output terminal of the output port according to at least one second control signal. The DC-AC converter also has a second capacitor connected across power terminals of the second bidirectional switch, where the second capacitor is configured to provide current to the second bidirectional switch to power the second bidirectional switch, and a second charging circuit configured to charge the second capacitor based on current flowing between the second transformer output terminal and the second output terminal of the output port, where each of the first and second bidirectional switches includes first and second transistors connected in series between first and second input/output terminals, and at least one transistor driver configured to drive the first and second transistors according to a received input signal.

Another inventive aspect is a bidirectional switch, including first and second transistors connected in series between first and second input/output terminals, at least one transistor driver configured to drive the first and second transistors according to a received input signal, and a charging circuit configured to provide current flowing between the first and second input/output to the at least one transistor driver so as to generate a voltage across power terminals of the at least one transistor driver.

Another inventive aspect is an electronic component, including a package base, and one or more GaN-based dies secured to the package base. The dies each include first and second transistors connected in series between first and second input/output terminals, at least one transistor driver configured to drive the first and second transistors according to a received input signal, and a charging circuit configured to provide current flowing between the first and second input/output to the at least one transistor driver so as to generate a voltage across power terminals of the at least one transistor driver.

DETAILED DESCRIPTION OF SPECIFIC EMBODIMENTS

Figure 1:
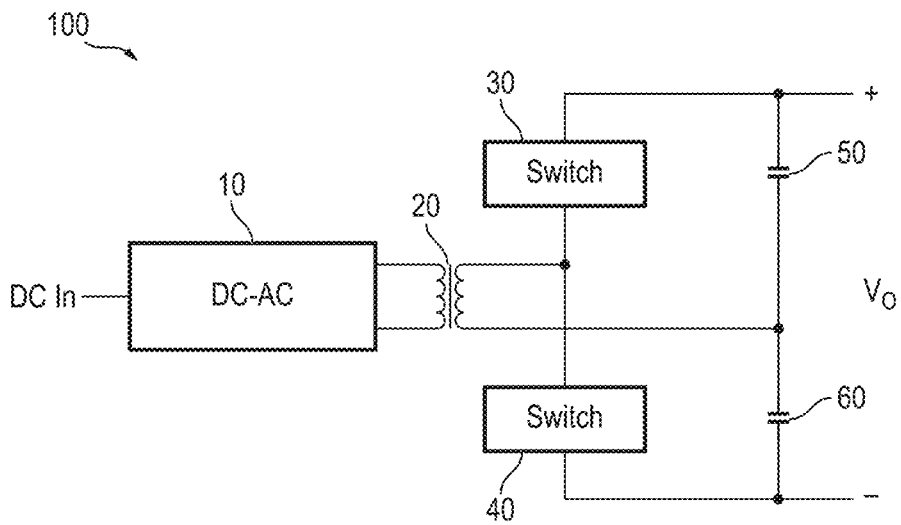
FIG. 1 is a simplified schematic diagram of a DC-AC converter or inverter circuit.

FIG. 1 is a simplified schematic diagram of a DC-AC converter or inverter circuit 100. DC-AC converter or inverter circuit 100 includes input DC-AC converter 10, power transformer 20, switches 30 and 40, and capacitors 50 and 60. DC-AC converter or inverter circuit 100 is configured to receive a DC voltage at its input DC in, and to generate an AC voltage at its output Vo.

Input DC-AC converter 10 converts the DC input voltage to an AC voltage. In some embodiments, the AC voltage has a peak-to-peak amplitude substantially equal to two times the DC voltage of the DC input voltage. Any of numerous circuit topologies may be used, and input DC-AC converter 10 is not limited. A non-limiting example of an embodiment of input DC-AC converter 10 is discussed below.

Switches 30 and 40 are bidirectional, such that each of switches 30 and 40 is configured to conduct current in either direction when conductive or on, and to substantially prevent current conduction in either direction when non-conductive or off.

Power transformer 20 may be any type of transformer and is not limited. Likewise, capacitors 50 and 60 may be any type of capacitor and are not limited in this embodiment.

In operation, power transformer 20 receives the AC voltage generated by input DC-AC converter 10 across its primary inductor, and generates an AC voltage across its secondary inductor in response to the received AC voltage. The frequency of the AC voltage at the secondary inductor is equal to the frequency of the received AC voltage and the amplitude of the AC voltage at the secondary inductor is dependent upon the structure of the power transformer 20.

Switches 30 and 40 are turned on and off using a PWM signal. The ratio of on time to off time or duty cycle of the PWM determines a rate of power transfer from the primary inductor to the secondary inductor and to the load.

Capacitors 50 and 60 filter the AC voltage output by the DC-AC converter circuit 100.

Figure 2:
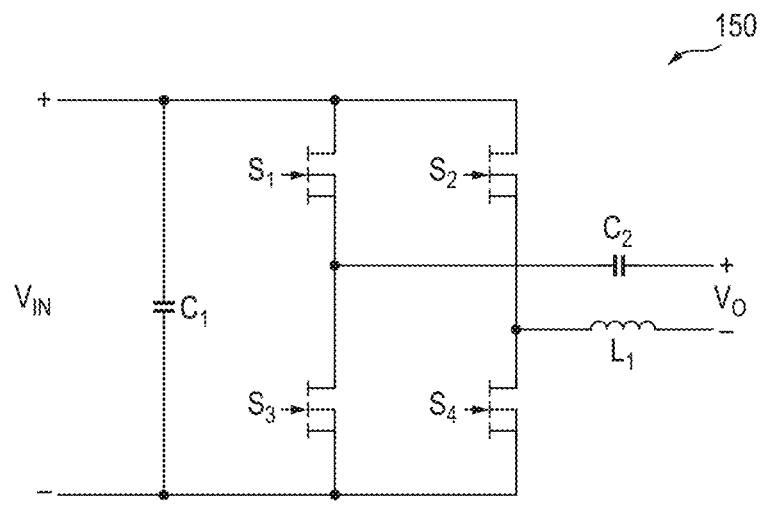
FIG. 2 is a simplified schematic diagram of a DC-AC converter circuit.

FIG. 2 is a simplified schematic diagram of a DC-AC converter circuit 150 which may be used as input DC-AC converter 10. In this embodiment, DC-AC converter circuit 150 includes capacitors C1 and C2, switches S1, S2, S3, and S4, and inductor L1.

Switches S1, S2, S3, and S4 may be driven by a controller (not shown) such that switches S1 and S4 are on at substantially the same times and switches S2 and S3 are on at substantially the same times, where switches S1 and S4 are on when S2 and S3 are off As a result, input DC-AC converter 10 converts the DC input voltage to an AC voltage. In some embodiments, the AC voltage has a peak-to-peak amplitude substantially equal to two times the DC voltage of the DC input voltage. Any of numerous circuit topologies may be used instead of DC-AC converter 10.

Capacitor C1 helps suppress switching noise on the DC input caused by the switching load presented to the input by the transistors Q1, Q2, Q3, and Q4, the capacitor C2, inductor L1, and a transformer connected across output Vo.

Capacitor C2, inductor L1 and the inductance of the transformer connected across output Vo form a resonant circuit and have values which determine the resonant frequency, which is related to the frequency of the input signals driven to transistors Q1, Q2, Q3, and Q4.

Figure 3A:
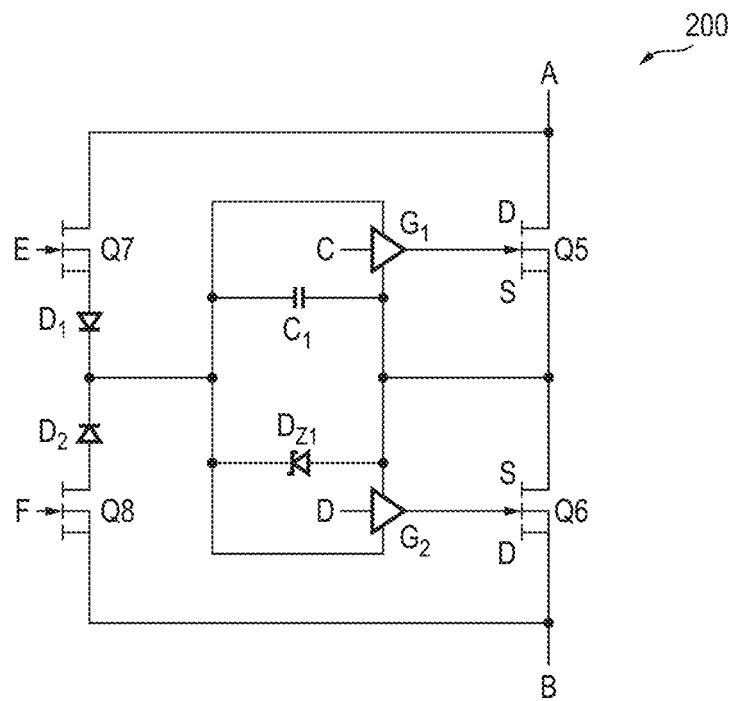
FIGS. 3A, 3B, 4A, and 4B are simplified schematic diagrams of bidirectional switch circuits.

FIG. 3A is a simplified schematic diagram of a bidirectional switch circuit 200. As shown, Bidirectional switch circuit 200 includes transistor drivers G1 and G2, capacitor C1, Zener diode DZ1, transistors Q7 and Q8, and diodes D1 and D2. As discussed in further detail below, capacitor C1, Zener diode DZ1, transistors Q7 and Q8, and diodes D1 and D2 collectively provide a power supply for transistor drivers G1 and G2.

In some embodiments, transistors Q5 and Q6 are integrated with transistor drivers G1 and G2. In some embodiments, transistors Q7 and Q8 are additionally integrated with transistor drivers G1 and G2 and transistors Q5 and Q6. In some embodiments, diodes D1 and D2 are additionally integrated with transistor drivers G1 and G2 and transistors Q5, Q6, Q7, and Q8. In some embodiments, either or both of capacitor C1 and Zener diode ZN1 are additionally integrated with transistor drivers G1 and G2, transistors Q5, Q6, Q7, and Q8, and diodes D1 and D2. In some embodiments, certain components are not integrated. The non-integrated components may be discrete components connected to a packaged chip having a substrate comprising each of the integrated components. For example, a package may include a GaN substrate upon which each of transistor drivers G1 and G2, transistors Q5, Q6, Q7, and Q8, and diodes D1 and D2 are integrally formed. In addition, the package may have pins which form electrical connections between the package and discrete components capacitor C1 and Zener diode ZN1.

In operation, transistors Q5 and Q6 are serially connected between input/output terminals A and B such that the sources of transistors Q5 and Q6 are connected together. As such, transistors Q5 and Q6 collectively form a bidirectional switch. If both of transistors Q5 and Q6 are on, the bidirectional switch circuit 200 forms a low resistance high conductivity path between input/output terminals A and B. Similarly, if both of transistors Q5 and Q6 are off, the bidirectional switch circuit 200 forms a high resistance low conductivity path between input/output terminals A and B. In addition, if Q5 is on and Q6 is off, the bidirectional switch circuit 200 forms a low resistance path between input/output terminals A and B in the direction of current flowing from A to B. Likewise, if Q5 is off and Q6 is on, the bidirectional switch circuit 200 forms a low resistance path between input/output terminals A and B in the direction of current flowing from B to A.

Transistor driver G1 drives the gate of transistor Q5 according to an input signal at its input terminal C. Likewise, transistor driver G2 drives the gate of transistor Q6 according to an input signal at its input terminal D.

In some applications, while the bidirectional switch circuit 200 presents a high resistance between input/output terminals A and B, the voltage difference between input/output terminals A and B is sufficient for powering transistor drivers G1 and G2.

For example, if, while the bidirectional switch circuit 200 presents a high resistance between input/output terminals A and B, and the voltage at terminal A is greater than the voltage at terminal B, transistor Q7 may be turned on such that a current path is established from terminal A through transistor Q7 and diode D1 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q6 to terminal B.

The components of the current path are sized such that current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal B such that the voltage across the parallel combination of capacitor C1 and Zener diode ZD1 remains at the voltage of the Zener diode ZD1.

Likewise, if, while the bidirectional switch circuit 200 presents a high resistance between input/output terminals A and B, and the voltage at terminal B is greater than the voltage at terminal A, transistor Q8 may be turned on such that a current path is established from terminal B through transistor Q8 and diode D2 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q5 to terminal A.

As with the case when the voltage at terminal A is greater than the voltage at terminal B, the components of the current path are sized such that when the voltage at terminal B is greater than the voltage at terminal A, current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal A such that the voltage across the parallel combination of capacitor C1 and Zener diode ZD1 remains at the voltage of the Zener diode ZD1.

Because the capacitor C1 is electrically connected across power terminals of the transistor driver circuits G1 and G2, and is charged to the voltage of the Zener diode ZD1, capacitor C1 provides current to transistor driver circuits G1 and G2 substantially at the voltage of the Zener diode ZD1. Using the current from the capacitor C1, transistor driver circuits G1 and G2 respectively drive the gates of transistors Q5 and Q6 according to inputs respectively received at their input terminals C and D.

Figure 3B:
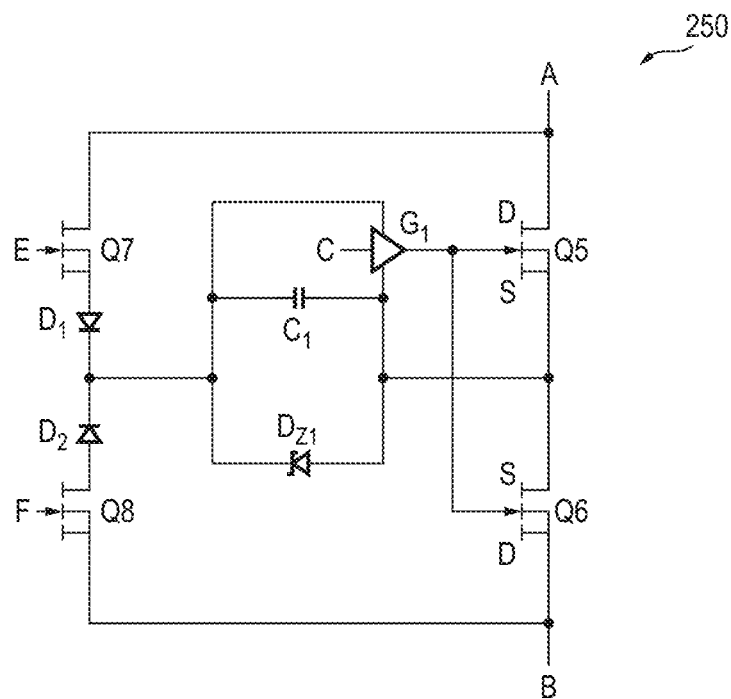

FIG. 3B is a simplified schematic diagram of a bidirectional switch circuit 250. As shown, Bidirectional switch circuit 250 includes transistor driver G1, capacitor C1, Zener diode DZ1, transistors Q7 and Q8, and diodes D1 and D2. As discussed in further detail below, capacitor C1, Zener diode DZ1, transistors Q7 and Q8, and diodes D1 and D2 collectively provide a power supply for transistor driver G1.

In some embodiments, transistors Q5 and Q6 are integrated with transistor driver G1. In some embodiments, transistors Q7 and Q8 are additionally integrated with transistor driver G1 and transistors Q5 and Q6. In some embodiments, diodes D1 and D2 are additionally integrated with transistor driver G1 and transistors Q5, Q6, Q7, and Q8. In some embodiments, either or both of capacitor C1 and Zener diode ZN1 are additionally integrated with transistor driver G1, transistors Q5, Q6, Q7, and Q8, and diodes D1 and D2. In some embodiments, certain components are not integrated. The non-integrated components may be discrete components connected to a packaged chip having a substrate comprising each of the integrated components. For example, a package may include a GaN substrate upon which each of transistor driver G1, transistors Q5, Q6, Q7, and Q8, and diodes D1 and D2 are integrally formed. In addition, the package may have pins which form electrical connections between the package and discrete components capacitor C1 and Zener diode ZN1.

In operation, transistors Q5 and Q6 are serially connected between input/output terminals A and B such that the sources of transistors Q5 and Q6 are connected together. As such, transistors Q5 and Q6 collectively form a bidirectional switch. If both of transistors Q5 and Q6 are on, the bidirectional switch circuit 250 forms a low resistance high conductivity path between input/output terminals A and B. Similarly, if both of transistors Q5 and Q6 are off, the bidirectional switch circuit 200 forms a high resistance low conductivity path between input/output terminals A and B. In addition, if Q5 is on and Q6 is off, the bidirectional switch circuit 250 forms a low resistance path between input/output terminals A and B in the direction of current flowing from A to B. Likewise, if Q5 is off and Q6 is on, the bidirectional switch circuit 250 forms a low resistance path between input/output terminals A and B in the direction of current flowing from B to A.

In this embodiment, transistor driver G1 drives the gate of both transistor Q5 and transistor Q6 according to an input signal at its input terminal C.

In some applications, while the bidirectional switch circuit 250 presents a high resistance between input/output terminals A and B, the voltage difference between input/output terminals A and B is sufficient for powering transistor driver G1.

For example, if, while the bidirectional switch circuit 250 presents a high resistance between input/output terminals A and B, and the voltage at terminal A is greater than the voltage at terminal B, transistor Q7 may be turned on such that a current path is established from terminal A through transistor Q7 and diode D1 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q6 to terminal B.

The components of the current path are sized such that current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal B such that the voltage across the parallel combination of capacitor C1 and Zener diode ZD1 remains at the voltage of the Zener diode ZD1.

Likewise, if, while the bidirectional switch circuit 250 presents a high resistance between input/output terminals A and B, and the voltage at terminal B is greater than the voltage at terminal A, transistor Q8 may be turned on such that a current path is established from terminal B through transistor Q8 and diode D2 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q5 to terminal A.

As with the case when the voltage at terminal A is greater than the voltage at terminal B, the components of the current path are sized such that when the voltage at terminal B is greater than the voltage at terminal A, current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal A such that the voltage across the parallel combination of capacitor C1 and Zener diode ZD1 remains at the voltage of the Zener diode ZD1.

Because the capacitor C1 is electrically connected across power terminals of the transistor driver circuit G1, and is charged to the voltage of the Zener diode ZD1, capacitor C1 provides current to transistor driver circuit G1 substantially at the voltage of the Zener diode ZD1. Using the current from the capacitor C1, transistor driver circuit G1 drives the gates of transistors Q5 and Q6 according to the input received at its input terminal C.

Figure 4A:
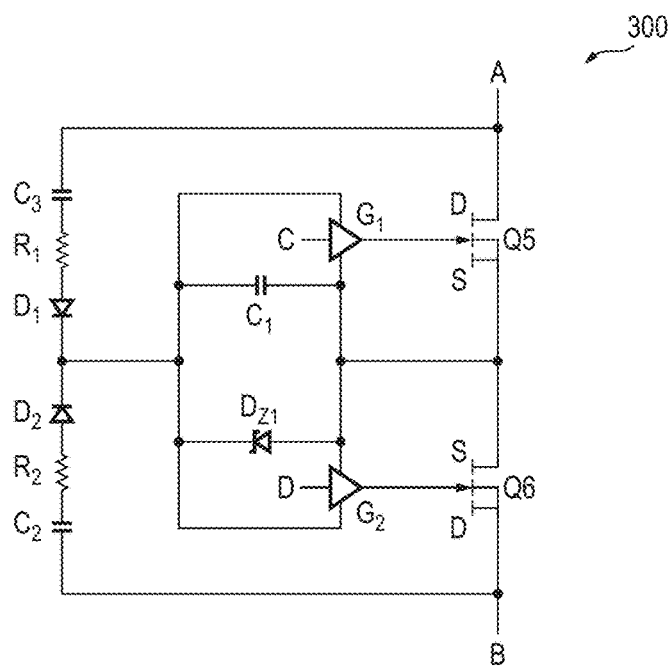

FIG. 4A is a simplified schematic diagram of a bidirectional switch circuit 300. As shown, Bidirectional switch circuit 300 includes transistor drivers G1 and G2, capacitor C1, Zener diode DZ1, capacitors C2 and C3, resistors R1 and R2, and diodes D1 and D2. As discussed in further detail below, capacitor C1, Zener diode DZ1, capacitors C2 and C3, resistors R1 and R2, and diodes D1 and D2 collectively provide a power supply for transistor drivers G1 and G2.

In some embodiments, transistors Q5 and Q6 are integrated with transistor drivers G1 and G2. In some embodiments, capacitors C2 and C3, and/or resistors R1 and R2, are additionally integrated with transistor drivers G1 and G2 and transistors Q5 and Q6. In some embodiments, diodes D1 and D2 are additionally integrated with transistor drivers G1 and G2, transistors Q5 and Q6, capacitors C2 and C3, and/or resistors R1 and R2. In some embodiments, either or both of capacitor C1 and Zener diode ZN1 are additionally integrated with transistor drivers G1 and G2, transistors Q5 and Q6, capacitors C2 and C3, and/or resistors R1 and R2, and diodes D1 and D2. In some embodiments, certain components are not integrated. The non-integrated components may be discrete components connected to a packaged chip having a substrate comprising each of the integrated components. For example, a package may include a GaN substrate upon which each of transistor drivers G1 and G2, transistors Q5 and Q6, capacitors C2 and C3, and/or resistors R1 and R2, and diodes D1 and D2 are integrally formed. In addition, the package may have pins which form electrical connections between the package and discrete components capacitor C1 and Zener diode ZN1.

In operation, transistors Q5 and Q6 are serially connected between input/output terminals A and B such that the sources of transistors Q5 and Q6 are connected together. As such, transistors Q5 and Q6 collectively form a bidirectional switch. If both of transistors Q5 and Q6 are on, the bidirectional switch circuit 300 forms a low resistance high conductivity path between input/output terminals A and B. Similarly, if both of transistors Q5 and Q6 are off, the bidirectional switch circuit 300 forms a high resistance low conductivity path between input/output terminals A and B. In addition, if Q5 is on and Q6 is off, the bidirectional switch circuit 300 forms a low resistance path between input/output terminals A and B in the direction of current flowing from A to B. Likewise, if Q5 is off and Q6 is on, the bidirectional switch circuit 300 forms a low resistance path between input/output terminals A and B in the direction of current flowing from B to A.

Transistor driver G1 drives the gate of transistor Q5 according to an input signal at its input terminal C. Likewise, transistor driver G2 drives the gate of transistor Q6 according to an input signal at its input terminal D.

In some applications, while the bidirectional switch circuit 300 presents a high resistance between input/output terminals A and B, the voltage difference between input/output terminals A and B is sufficient for powering transistor drivers G1 and G2.

For example, if, while the bidirectional switch circuit 300 presents a high resistance between input/output terminals A and B, the voltage at terminal A is increasing with respect to the voltage at terminal B, capacitor C3 injects charge through resistor R1 such that a current path is established from terminal A through capacitor C3, resistor R1, and diode D1 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q6 to terminal B.

The components of the current path are sized such that current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal B such that the voltage across the parallel combination of capacitor C1 and Zener diode ZD1 remains at the voltage of the Zener diode ZD1.

Likewise, if, while the bidirectional switch circuit 300 presents a high resistance between input/output terminals A and B, and the voltage at terminal B is increasing with respect to the voltage at terminal A, capacitor C2 injects charge through resistor R1 such that a current path is established from terminal B through capacitor C2, resistor R2, and diode D2 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q5 to terminal A.

As with the case when the voltage at terminal A is increasing with respect to the voltage at terminal B, the components of the current path are sized such that when the voltage at terminal B is increasing with respect to the voltage at terminal A, current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal A such that the voltage across the parallel combination of capacitor C1 and Zener diode ZD1 remains at the voltage of the Zener diode ZD1.

Because the capacitor C1 is electrically connected across power terminals of the transistor driver circuits G1 and G2, and is charged to the voltage of the Zener diode ZD1, capacitor C1 provides current to transistor driver circuits G1 and G2 substantially at the voltage of the Zener diode ZD1. Using the current from the capacitor C1, transistor driver circuits G1 and G2 respectively drive the gates of transistors Q5 and Q6 according to inputs respectively received at their input terminals C and D.

Figure 4B:
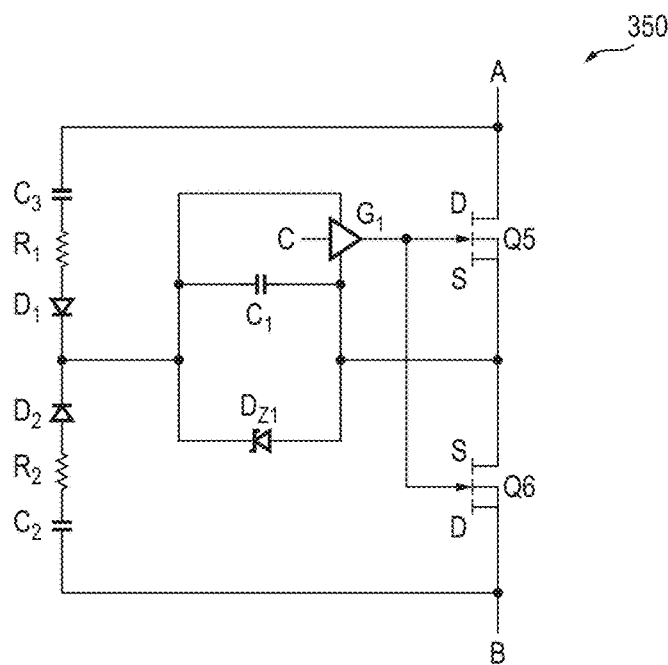

FIG. 4B is a simplified schematic diagram of a bidirectional switch circuit 350. As shown, Bidirectional switch circuit 340 includes transistor driver G1, capacitor C1, Zener diode DZ1, capacitors C2 and C3, resistors R1 and R2, and diodes D1 and D2. As discussed in further detail below, capacitor C1, Zener diode DZ1, capacitors C2 and C3, resistors R1 and R2, and diodes D1 and D2 collectively provide a power supply for transistor driver G1.

In some embodiments, transistors Q5 and Q6 are integrated with transistor driver G1. In some embodiments, capacitors C2 and C3, and/or resistors R1 and R2, are additionally integrated with transistor driver G1 and transistors Q5 and Q6. In some embodiments, diodes D1 and D2 are additionally integrated with transistor driver G1, transistors Q5 and Q6, capacitors C2 and C3, and/or resistors R1 and R2. In some embodiments, either or both of capacitor C1 and Zener diode ZN1 are additionally integrated with transistor driver G1, transistors Q5 and Q6, capacitors C2 and C3, and/or resistors R1 and R2, and diodes D1 and D2. In some embodiments, certain components are not integrated. The non-integrated components may be discrete components connected to a packaged chip having a substrate comprising each of the integrated components. For example, a package may include a GaN substrate upon which each of transistor driver G1, transistors Q5 and Q6, capacitors C2 and C3, and/or resistors R1 and R2, and diodes D1 and D2 are integrally formed. In addition, the package may have pins which form electrical connections between the package and discrete components capacitor C1 and Zener diode ZN1.

In operation, transistors Q5 and Q6 are serially connected between input/output terminals A and B such that the sources of transistors Q5 and Q6 are connected together. As such, transistors Q5 and Q6 collectively form a bidirectional switch. If both of transistors Q5 and Q6 are on, the bidirectional switch circuit 350 forms a low resistance high conductivity path between input/output terminals A and B. Similarly, if both of transistors Q5 and Q6 are off, the bidirectional switch circuit 350 forms a high resistance low conductivity path between input/output terminals A and B. In addition, if Q5 is on and Q6 is off, the bidirectional switch circuit 350 forms a low resistance path between input/output terminals A and B in the direction of current flowing from A to B. Likewise, if Q5 is off and Q6 is on, the bidirectional switch circuit 350 forms a low resistance path between input/output terminals A and B in the direction of current flowing from B to A.

Transistor driver G1 drives the gate of both transistor Q5 and transistor Q6 according to an input signal at its input terminal C.

In some applications, while the bidirectional switch circuit 350 presents a high resistance between input/output terminals A and B, the voltage difference between input/output terminals A and B is sufficient for powering transistor driver G1.

For example, if, while the bidirectional switch circuit 350 presents a high resistance between input/output terminals A and B, the voltage at terminal A is increasing with respect to the voltage at terminal B, capacitor C3 injects charge through resistor R1 such that a current path is established from terminal A through capacitor C3, resistor R1, and diode D1 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q6 to terminal B.

The components of the current path are sized such that current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal B such that the voltage across the parallel combination of capacitor C1 and Zener diode ZD1 remains at the voltage of the Zener diode ZD1.

Likewise, if, while the bidirectional switch circuit 350 presents a high resistance between input/output terminals A and B, and the voltage at terminal B is increasing with respect to the voltage at terminal A, capacitor C2 injects charge through resistor R1 such that a current path is established from terminal B through capacitor C2, resistor R2, and diode D2 to the parallel combination of capacitor C1 and Zener diode ZD1. The current path continues through the parallel combination of capacitor C1 and Zener diode ZD1 to the common source node of transistors Q5 and Q6, and from the common source node of transistors Q5 and Q6 through the body diode of transistor Q5 to terminal A.

As with the case when the voltage at terminal A is increasing with respect to the voltage at terminal B, the components of the current path are sized such that when the voltage at terminal B is increasing with respect to the voltage at terminal A, current flowing through the parallel combination of capacitor C1 and Zener diode ZD1 charges capacitor C1 to the voltage of the Zener diode ZD1. Prior to the voltage across the parallel combination of capacitor C1 and Zener diode ZD1 reaching the voltage of the Zener diode ZD1, the current charges the capacitor C1 and increases the voltage across the parallel combination. Once the voltage increases to the voltage of the Zener diode ZD1, the Zener diode ZD1 shunts additional current to the common source node and to terminal A such that the voltage across the parallel combination of capacitor C1 and Zener diode ZD1 remains at the voltage of the Zener diode ZD1.

Because the capacitor C1 is electrically connected across power terminals of the transistor driver circuit G1, and is charged to the voltage of the Zener diode ZD1, capacitor C1 provides current to transistor driver circuit G1 substantially at the voltage of the Zener diode ZD1. Using the current from the capacitor C1, transistor driver circuit G1 drives the gates of transistors Q5 and Q6 according to an input received at its input terminal C.

Figure 5:
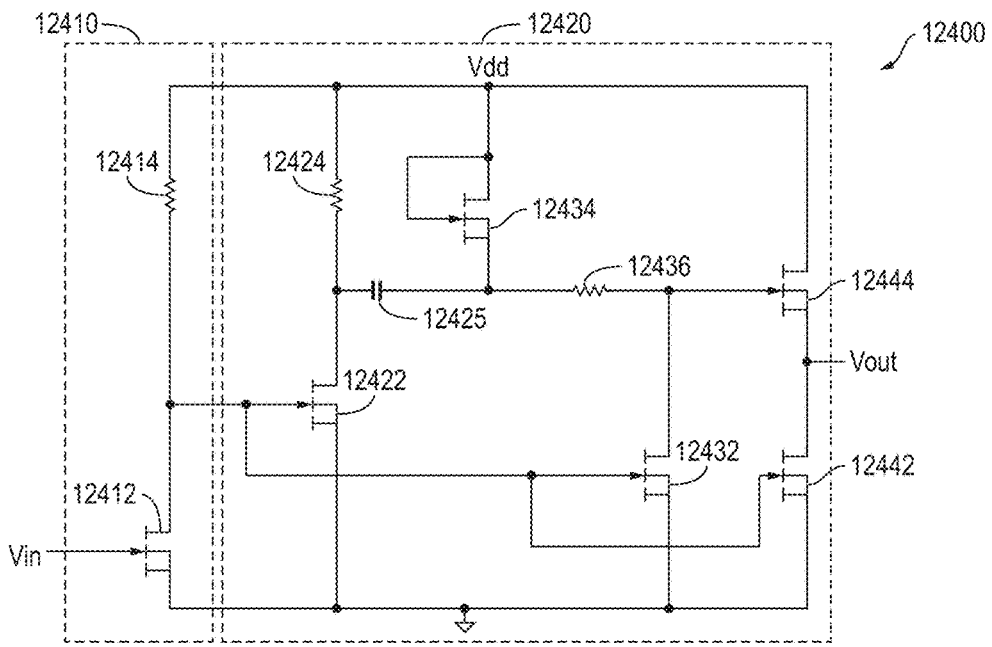
FIG. 5 is a schematic circuit diagram of an embodiment of a transistor driver.

FIG. 5 is a schematic circuit diagram of an embodiment of a transistor driver 12400, which is an implementation of driver G1 or G2 of FIGS. 3A, 3B, 4A, and 4B. Transistor driver 12400 provides a non-inverting rail to rail output and includes first inverter 12410 and second inverter 12420.

First inverter 12410 includes FET 12412 and resistor 12414. In some embodiments, other inverting logic gates may be used.

Second inverter 12420 includes pull-down device FET 12442, pull-up device FET 12444, and control circuitry comprising FET 12422, resistor 12424, capacitor 12425, diode connected FET 12434, resistor 12436, and FET 12432.

In response to Vin being Low, the output of the first inverter 12410 is High, which turns on pull-down device FET 12442, causing output to go Low. Also, the output of the first inverter 12410 being High causes FET 12432 to pull the gate of pull-up device FET 12444 low, which turns off FET 12444. Furthermore, with Vin Low, the FET 12422 and diode connected FET 12434 cause the capacitor to be charged to Vdd-Vth.

In response to Vin transitioning High, the output of the first inverter 12410 transitions Low, turning off pull-down device FET 12442 and FET 12432, respectively allowing the output and the gate of pull-up device FET 12444 to go High. In addition, FET 12422 turns off, allowing the voltage at its drain to go High. This causes the capacitor 12425 to inject charge onto the gate of pull-up device FET 12444 through resistor 12436, thereby causing the gate of pull-up device FET 12444 to go above Vdd (e.g. approximately 2*Vdd− Vth). In response to its gate voltage, pull-up device FET 12444 drives the output to Vdd.

In some embodiments, the resistor 12436 is replaced by one or more depletion mode FETs to increase circuit response speed.

Figure 6:
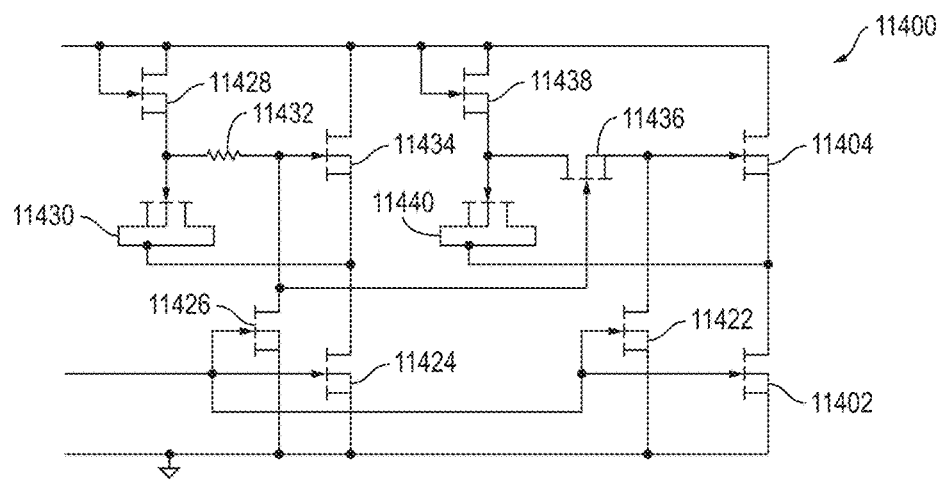
FIG. 6 is a schematic circuit diagram of an embodiment of an inverter.

FIG. 6 is a schematic circuit diagram of an embodiment of an inverter 11400, which is an implementation of an inverter which can be used in combination with another inverter of the same or a different topology to form an implementation of driver G1 or G2 of FIGS. 3 and 4.

Inverter 11400 includes pull-down device 11402, pull-up device 11404, and control circuitry which includes pull-down FETs 11422, 11424, and 11426, capacitor FETs 11430 and 11440, diode FETs 11428 and 11438, resistor 11432, pull-up FET 11434, and pass FET 11436.

In the embodiment of FIG. 6, the pull-down FET 11402 receives the input voltage at its gate along with pull-down FET 11422. In response to a high input, pull-down FET 11402 is turned on and the output is pulled to ground. In addition, pull-down FET 11422 is turned on and pass FET 11436 is turned off by pull-down FET 11426 so that the gate of the pull-up FET 11404 is pulled to ground to prevent shoot through current.

In response to a low input, pull-down FETs 11402 and 11422 are turned off. In addition, the pass FET 11436 is turned on by the voltage at its gate, which is driven high by capacitive coupling of capacitor FET 11430 caused by pull-down FET 11424 turning off in response to the low input such that pull-up FET 11434 drives the bottom plate of capacitor FET 11430 high.

Additionally, the drain voltage of the pass FET 11436 is pulled up by capacitive coupling of the output voltage onto the drain of the pass FET 11436 by capacitor FET 11440. As a result of the capacitive coupling, the drain voltage of the pass FET 11436 increases to a voltage greater than Vdd. Consequently, the gate of pull-up device 11404 is driven by the control circuitry to be greater than Vdd such that pull-up FET 11404 drives the output to Vdd.

In this embodiment, an actively controlled transistor (pass FET 11436) is used to selectively connect the gate of the pull-up FET 11404 to the top plate of capacitor FET 11440. As a result, the capacitor FET 11440 can drive a larger capacitive load than would be the case if, for example, a resistor were used instead of the actively controlled transistor. Consequently, pull-up FET 11404 can be larger to provide more current to the output Vout. Therefore, for positive transitions, the pass FET 11436 acts as a low capacitance input to a buffer, which is driven by an inverter, and which has a current driving capacity based on pull-up FET 11404, where the current driving capacity of the pull-up FET 11404 is greater than the current driving capacity of the driving inverter.

Other inverter, buffer, and driver circuits may be used as or to form transistor driver circuits G1 and G2 of FIGS. 3 and 4. For example, circuits may be used which are discussed in (U.S. patent application Ser. No. 14/737,259, filed Jun. 11, 2015, titled GaN Circuit Drivers for GaN Circuit Loads, which is incorporated herein by reference.

Figure 7:
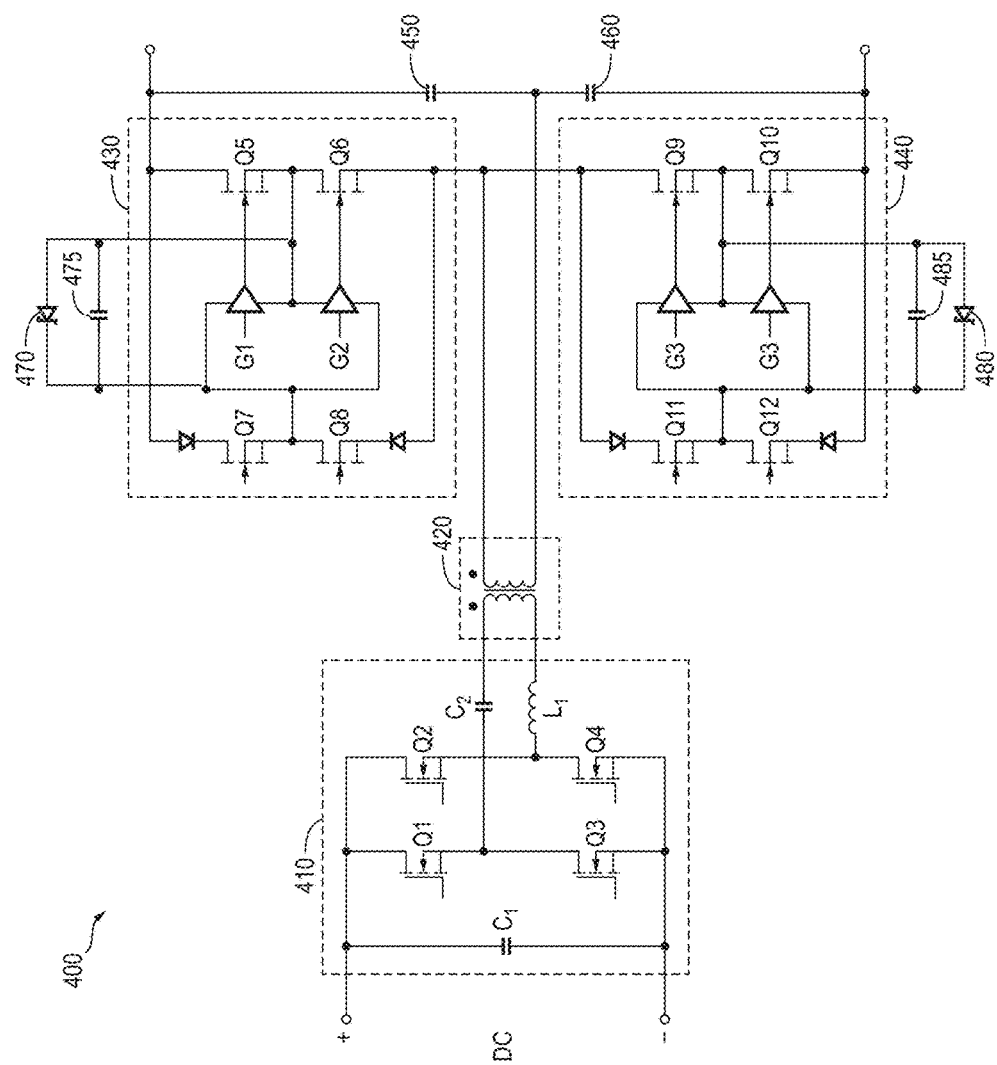
FIG. 7 is schematic circuit diagram of an embodiment of a power inverter circuit.

FIG. 7 is schematic circuit diagram of an embodiment of a power inverter circuit 400. DC-AC converter or inverter circuit 400 includes input DC-AC converter 410, power transformer 420, switches 430 and 440, capacitors 450 and 460, Zener diodes 470 and 480, and capacitors 475 and 485.

Inverter circuit 100 is configured to receive a DC voltage at its input DC in, and to generate an AC voltage at its output Vo.

Input DC-AC converter 410 converts the DC input voltage to an AC voltage. In some embodiments, input DC-AC converter 410 is similar or identical to DC-AC converter circuit 150 discussed above with reference to FIG. 2. Other input DC-AC converter circuits may alternatively be used.

Switches 430 and 440 are bidirectional, and may be similar to or identical to bidirectional switch circuit 200 discussed above with reference to FIG. 3A. In some embodiments, bidirectional switches 430 and 440 may have alternative architectures. For example, bidirectional switches similar to or identical to bidirectional switch circuits 250, 300, and 350, respectively discussed above with reference to FIGS. 3B, 4A, and 4B or other bidirectional switch architectures may be used.

Power transformer 420 may be any type of transformer and is not limited in this embodiment. Likewise, capacitors 450 and 460 may be any type of capacitor and are not limited in this embodiment.

In operation, power transformer 420 receives the AC voltage generated by input DC-AC converter 410 across its primary inductor, and generates an AC voltage across its secondary inductor in response to the received AC voltage. The frequency of the AC voltage at the secondary inductor is equal to the frequency of the received AC voltage and the amplitude of the AC voltage at the secondary inductor is dependent upon the structure of the power transformer 420.

Capacitors 450 and 460 filter the AC voltage output by the DC-AC converter circuit 400.

Figure 8:
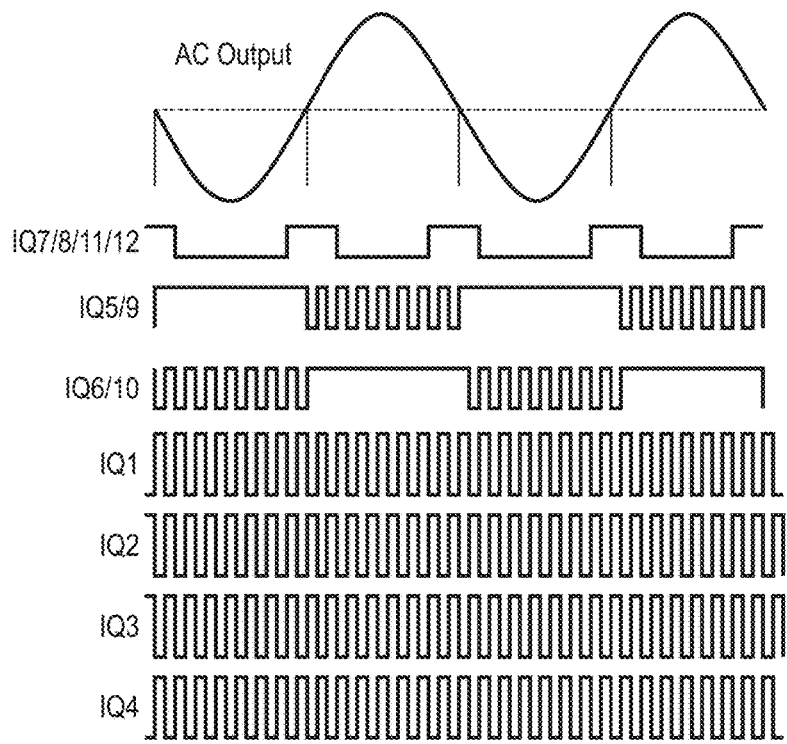
FIGS. 8 and 9 are waveform diagrams illustrating input and output waveforms of a method of operating the DC-AC converter circuit according to some embodiments.

FIG. 8 is a waveform diagram illustrating input and output waveforms of a method of operating the DC-AC converter circuit 400 according to some embodiments.

Input signals IQ1, IQ2, IQ3, and IQ4 are respectively applied to corresponding transistors Q1, Q2, Q3, and Q4. As discussed in further detail above with reference to FIG. 2, and with reference to FIG. 8, during sequential periods, transistors Q1 and Q4 are alternately turned on and turned off by input signals IQ1 and IQ4, respectively. As shown, input signals IQ1 and IQ4 are substantially of the same phase and amplitude. Similarly, during sequential periods, transistors Q2 and Q3 are alternately turned on and turned off by input signals IQ2 and IQ3, respectively. As shown, input signals IQ2 and IQ3 are substantially of the same phase and amplitude, and are of substantially opposite phase as input signals IQ1 and IQ4.

In response to the input signals IQ1, IQ2, IQ3, and IQ4, input DC-AC converter 410 converts the DC input voltage to an AC voltage, which is applied across the primary inductor of transformer 420. In some embodiments, the AC voltage has a peak-to-peak amplitude substantially equal to two times the DC voltage of the DC input voltage. Any of numerous circuit topologies may be used instead of DC-AC converter 410.

Input signal IQ5/9 is applied to transistor drivers G1 and G3. In addition, input signal IQ6/10 is respectively applied to transistor drivers G2 and G4. Bidirectional switches 430 and 440 are turned on and off in response to input signals IQ5/9 and IQ6/10. The ratio of on time to off time or duty cycle of the input signals IQ5/9 and IQ6/10 determines a rate of power transfer from the primary inductor to the secondary inductor and to the load.

Input signal IQ7/8/11/12 is applied to transistors Q7, Q8, Q11, and Q12. Transistors Q7, Q8, Q11, and Q12 are turned on and off in response to input signal IQ7/8/11/12, such that capacitors 475 and 485 are charged and provide power to transistor drivers G1, G2, G3, and G4, as discussed above with reference to FIG. 3.

In response to the DC voltage at DC in, and input signals IQ1, IQ2, IQ3, IQ4, IQ5/9, IQ6/10, and IQ7/8/11/12 DC-AC converter 400 generates a substantially sinusoidal voltage ac output across Vo.

As shown, input signal IQ7/8/11/12 is configured such that transistors Q7, Q8, Q11, and Q12 are turned on only during times when the ac output across Vo has a magnitude less than a threshold. As a result, capacitors 475 and 485 may be charged sufficiently to power the transistor drivers G1, G2, G3, and G4 without subjecting the transistor drivers G1, G2, G3, and G4, diodes 470 and 480, and capacitors 475 and 485 to voltages exceeding a maximum voltage determined by the threshold.

In some embodiments, input signal IQ7/8/11/12 is configured such that transistors Q7, Q8, Q11, and Q12 are turned on and off so that the ac output across bidirectional switches 430 and 440 causes the capacitors 475 and 485 to be charged to a desired voltage for powering the transistor drivers G1, G2, G3, and G4 of bidirectional switches 430 and 440. For example, input signal IQ7/8/11/12 may be configured such that transistors Q7, Q8, Q11, and Q12 are on while the ac output is substantially equal to the desired voltage, and off otherwise. In some of such and other embodiments, Zener diodes 470 and 480 are not used.

Figure 9:
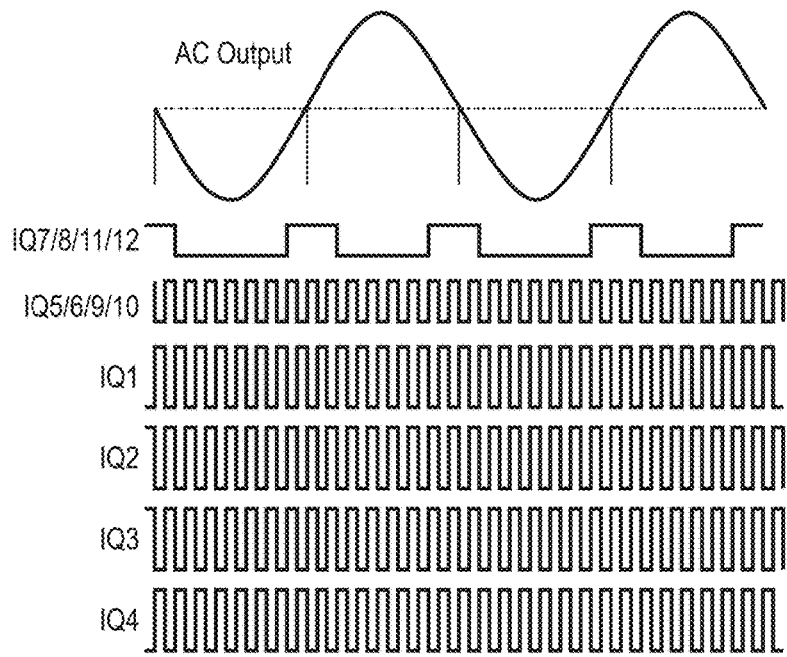

In some embodiments of the inverter circuit 400 of FIG. 7, a bidirectional switch having a single transistor driver configured to drive two or both transistors of the switch is used. For example, bidirectional switch 250 illustrated in FIG. 3B may be used in some embodiments of inverter circuit 400. FIG. 9 is a waveform diagram illustrating input and output waveforms of a method of operating the DC-AC converter circuit 400 according to such embodiments.

Input signals IQ1, IQ2, IQ3, and IQ4 are respectively applied to corresponding transistors Q1, Q2, Q3, and Q4. As discussed in further detail above with reference to FIG. 2, and with reference to FIG. 9, during sequential periods, transistors Q1 and Q4 are alternately turned on and turned off by input signals IQ1 and IQ4, respectively. As shown, input signals IQ1 and IQ4 are substantially of the same phase and amplitude. Similarly, during sequential periods, transistors Q2 and Q3 are alternately turned on and turned off by input signals IQ2 and IQ3, respectively. As shown, input signals IQ2 and IQ3 are substantially of the same phase and amplitude, and are of substantially opposite phase as input signals IQ1 and IQ4.

In response to the input signals IQ1, IQ2, IQ3, and IQ4, input DC-AC converter 410 converts the DC input voltage to an AC voltage, which is applied across the primary inductor of transformer 420. In some embodiments, the AC voltage has a peak-to-peak amplitude substantially equal to two times the DC voltage of the DC input voltage. Any of numerous circuit topologies may be used instead of DC-AC converter 410.

Input signal IQ5/6/9/10 is respectively applied to the transistor drivers of the bidirectional switches, which are turned on and off in response to input signal IQ5/6/9/10. The ratio of on time to off time or duty cycle of the input signal IQ5/6/9/10 determines a rate of power transfer from the primary inductor to the secondary inductor and to the load.

Input signal IQ7/8/11/12 is applied to transistors Q7, Q8, Q11, and Q12. Transistors Q7, Q8, Q11, and Q12 are turned on and off in response to input signal IQ7/8/11/12, such that capacitors 475 and 485 are charged and provide power to the transistor drivers of bidirectional switches 430 and 440, as discussed above with reference to FIG. 3B.

In response to the DC voltage at DC in, and input signals IQ1, IQ2, IQ3, IQ4, IQ5/6/9/10, and IQ7/8/11/12, DC-AC converter 400 generates a substantially sinusoidal voltage ac output across Vo.

As shown, input signal IQ7/8/11/12 is configured such that transistors Q7, Q8, Q11, and Q12 are turned on only during times when the ac output across Vo has a magnitude less than a threshold. As a result, capacitors 475 and 485 may be charged sufficiently to power the transistor drivers of the bidirectional switches 430 and 440 without subjecting the transistor drivers, diodes 470 and 480, and capacitors 475 and 485 to voltages exceeding a maximum voltage determined by the threshold.

In some embodiments, input signal IQ7/8/11/12 is configured such that transistors Q7, Q8, Q11, and Q12 are turned on and off so that the ac output across bidirectional switches 430 and 440 causes the capacitors 475 and 485 to be charged to a desired voltage for powering the transistor drivers of bidirectional switches 430 and 440. For example, input signal IQ7/8/11/12 may be configured such that transistors Q7, Q8, Q11, and Q12 are on while the ac output is substantially equal to the desired voltage, and off otherwise. In some of such and other embodiments, Zener diodes 470 and 480 are not used.

Electronic Packaging

Figure 10:
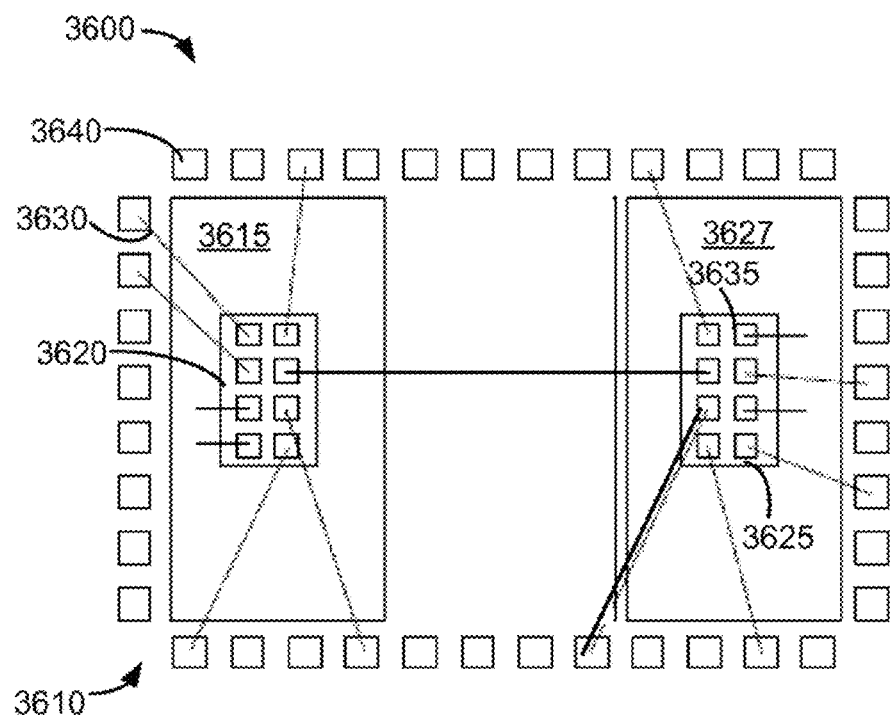
FIG. 10 illustrates an example of a quad-flat no-lead electronic package with two semiconductor devices within it.
Figure 11:
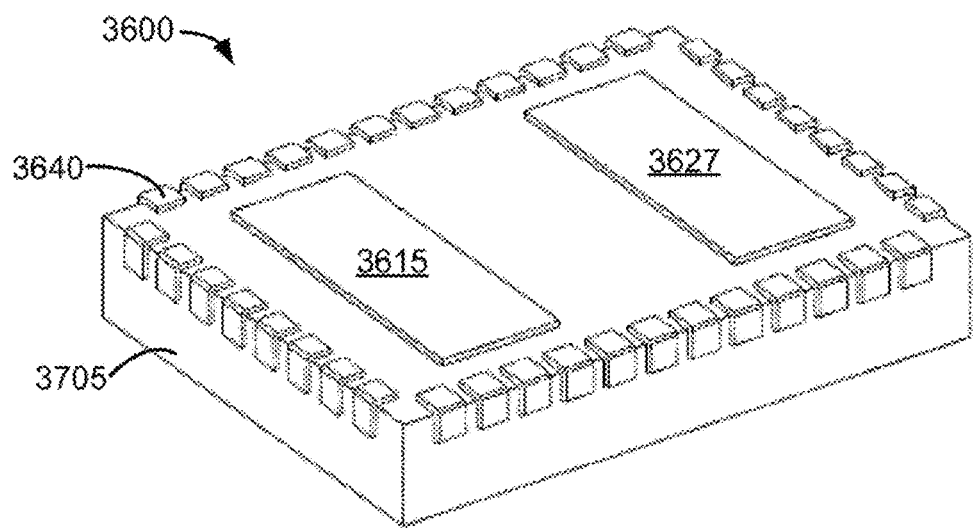
FIG. 11 is an isometric view of an electronic package.

Now referring to FIGS. 10 and 11, in some embodiments, one or more of the embodiments discussed herein may be disposed in one or more electronic packages. Myriad packaging configurations and types of electronic packages are available and are within the scope of this disclosure. FIG. 10 illustrates one example of what is known as a quad-flat no-lead electronic package with two semiconductor devices within it.

Electronic package 3600 may have a package base 3610 that has one or more die pads 3615 surrounded by one or more terminals 3630. In some embodiments package base 3610 may comprise a leadframe while in other embodiments it may comprise an organic printed circuit board, a ceramic circuit or another material.

In the embodiment depicted in FIG. 10, a first device 3620 is mounted to a first die pad 3615 and a second device 3625 is mounted to a second die pad 3627, where either or each of first device 3620 and second device 3625 are embodiments of and have features of devices discussed elsewhere herein. In another embodiment one or more of first and second devices 3620, 3625, respectively may be mounted on an insulator (not shown) that is mounted to package base 3610. In one embodiment the insulator may be a ceramic or other non-electrically conductive material. First and second devices 3620, 3625, respectively are electrically coupled to terminals 3640 with wire bonds 3630 or any other type of electrical interconnect such as, for example, flip-chip bumps or columns that may be used in a flip-chip application. Wirebonds 3630 may extend between device bond pads 3635 to terminals 3640, and in some cases to die pads 3615, 3627 and in other cases to device bond pads 3635 on an adjacent device.

Now referring to FIG. 11, an isometric view of electronic package 3600 is shown. Terminals 3640 and die attach pads 3615 and 3627 may be disposed on an external surface and configured to attach to a printed circuit board or other device. In further embodiments, terminals 3640 and die attach pads 3615 and 3627 may only be accessible within the inside of electronic package 3600 and other connections may be disposed on the outside of the electronic package.

More specifically, some embodiments may have internal electrical routing and there may not be a one to one correlation between internal and external connections.

In further embodiments first and second devices 3620, 3625, respectively (see FIG. 10) and a top surface of package base 3610 may be encapsulated by a non-electrically conductive material, such as for example, a molding compound. Myriad other electronic packages may be used such as, but not limited to, SOIC's, DIPS, MCM's and others. Further, in some embodiments each device may be in a separate electronic package while other embodiments may have two or more electronic devices within a single package. Other embodiments may have one or more passive devices within one or more electronic packages.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A DC-AC converter configured to receive an input DC signal and to generate an output AC signal, the DC-AC converter comprising:
   an input port comprising first and second input terminals;
   an output port comprising first and second output terminals;
   an input DC-AC converter configured to receive the input DC signal from the input port and to generate a first AC signal;
   a transformer device configured to receive the first AC signal and to generate a second AC signal across first and second transformer output terminals;
   a first bidirectional switch connected between the first transformer output terminal and the first output terminal of the output port, wherein the first bidirectional switch is configured to selectively conduct current between the first transformer output terminal and the first output terminal of the output port according to at least one first control signal;
   a first capacitor connected across power terminals of the first bidirectional switch, wherein the first capacitor is configured to provide current to the first bidirectional switch to power the first bidirectional switch;
   a first charging circuit, configured to charge the first capacitor based on current flowing between the first transformer output terminal and the first output terminal of the output port;
   a second bidirectional switch connected between the second transformer output terminal and the second output terminal of the output port, wherein the second bidirectional switch is configured to selectively conduct current between the second transformer output terminal and the second output terminal of the output port according to at least one second control signal;
   a second capacitor connected across power terminals of the second bidirectional switch, wherein the second capacitor is configured to provide current to the second bidirectional switch to power the second bidirectional switch; and
   a second charging circuit transformer output terminal and the second output terminal of the output port,
   wherein each of the first and second bidirectional switches comprises:
   first and second transistors connected in series between first and second input/output terminals;
   at least one transistor driver configured to drive the first and second transistors according to a received input signal; and
   a first Zener diode connected in parallel with the first capacitor, wherein the first Zener diode is configured to regulate the voltage to which the first charging circuit charges the first capacitor.

2. The DC-AC converter of claim 1, wherein the first and second transistors of each of the first and second bidirectional switches comprise GaN-based transistors.

3. The DC-AC converter of claim 1, wherein each of the first and second bidirectional switches comprises a single substrate, wherein the first and second transistors and the at least one transistor driver of each of the first and second bidirectional switches comprise GaN-based transistors integrated on the single substrate.

4. The DC-AC converter of claim 1, wherein the first and second transistors and the at least one transistor driver of both of the first and second bidirectional switches comprise GaN-based transistors integrated on a single substrate.

5. The DC-AC converter of claim 1, wherein each of the first and second bidirectional switches comprises first and second transistor drivers, respectively configured to drive the first and second transistors according to first and second received signals.

6. The DC-AC converter of claim 1, wherein the first charging circuit comprises a switch configured to selectively conduct current between the first transformer output terminal and the first output terminal of the output port and through the first capacitor to charge the first capacitor.

7. The DC-AC converter of claim 1, wherein the first charging circuit comprises a charging capacitor configured to capacitively couple current between the first transformer output terminal and the first output terminal of the output port and through the first capacitor to charge the first capacitor.

* * * * *